(12) United States Patent
Aritome

(10) Patent No.: US 8,369,147 B2
(45) Date of Patent: *Feb. 5, 2013

(54) NON-VOLATILE MULTILEVEL MEMORY CELL PROGRAMMING

(75) Inventor: Seiichi Aritome, Zhudong (TW)

(73) Assignee: Micron Technology, Inc., Boise, ID (US)

( * ) Notice: Subject to any disclaimer, the term of this patent is extended or adjusted under 35 U.S.C. 154(b) by 291 days.

This patent is subject to a terminal disclaimer.

(21) Appl. No.: 12/726,525

(22) Filed: Mar. 18, 2010

(65) Prior Publication Data

US 2010/0182832 A1 Jul. 22, 2010

Related U.S. Application Data

(63) Continuation of application No. 11/646,658, filed on Dec. 28, 2006, now Pat. No. 7,701,765.

(51) Int. Cl.
*G11C 11/34* (2006.01)
*G11C 16/04* (2006.01)

(52) U.S. Cl. ......... 365/185.12; 365/185.18; 365/185.22; 365/185.28

(58) Field of Classification Search . 365/185.01–185.33
See application file for complete search history.

(56) References Cited

U.S. PATENT DOCUMENTS

| | | | |
|---|---|---|---|
| 5,768,193 A | 6/1998 | Lee et al. | |
| 5,903,495 A | 5/1999 | Takeuchi et al. | |
| 6,219,276 B1 | 4/2001 | Parker | |
| 6,522,580 B2 | 2/2003 | Chen et al. | |
| 6,538,923 B1 | 3/2003 | Parker | |
| 7,035,144 B2 | 4/2006 | Kim et al. | |
| 7,088,615 B2 | 8/2006 | Guterman et al. | |
| 7,095,654 B2 | 8/2006 | Quader et al. | |
| 7,120,051 B2 | 10/2006 | Gorobets et al. | |
| 7,224,613 B2 * | 5/2007 | Chen et al. | 365/185.22 |
| 7,366,017 B2 * | 4/2008 | Abraham | 365/185.12 |
| 7,952,922 B2 | 5/2011 | Aritome | |
| 2003/0128586 A1 | 7/2003 | Chen et al. | |
| 2004/0170056 A1 | 9/2004 | Shibata et al. | |
| 2005/0213393 A1 | 9/2005 | Lasser | |
| 2006/0101193 A1 | 5/2006 | Murin | |
| 2006/0140002 A1 | 6/2006 | Kim et al. | |
| 2007/0109854 A1 * | 5/2007 | Shibata | 365/185.08 |
| 2007/0297245 A1 | 12/2007 | Mokhlesi | |

FOREIGN PATENT DOCUMENTS

| | | |
|---|---|---|
| EP | 0797212 A2 | 6/1997 |
| EP | 0797212 A2 | 9/1997 |
| EP | 1271553 A2 | 1/2003 |
| WO | 2004/023489 A1 | 3/2004 |
| WO | 2004023489 A1 | 3/2004 |
| WO | 2006/107731 A1 | 10/2006 |

OTHER PUBLICATIONS

Office Action and Search Report for related Taiwan Patent Application No. 096150518 dated Oct. 11, 2011 (8 pages).
Notice of Rejection dated Dec. 21, 2010 (10 pgs.).
International Search Report and Written Opinion for related PCT Application PCT/US2007/025457, dated Aug. 5, 2008. (13 pgs.).

* cited by examiner

*Primary Examiner* — Kretelia Graham
(74) *Attorney, Agent, or Firm* — Brooks, Cameron & Huebsch, PLLC

(57) ABSTRACT

The present disclosure includes methods, devices, modules, and systems for programming multilevel non-volatile memory cells, each cell having a number of lower pages and an upper page. One method includes programming a first lower page, programming a second lower page, programming a third lower page, programming an upper page, and reprogramming the upper page of a cell.

17 Claims, 9 Drawing Sheets

| | EVEN | | | | | ODD | | | | |
|---|---|---|---|---|---|---|---|---|---|---|
| | LP-1 | LP-2 | LP-3 | UP | BP | LP-1 | LP-2 | LP-3 | UP | BP |
| WL31 | 236 | 244 | 250 | 254 | 254-BP af253-BP | 237 | 245 | 251 | 255 | 255-BP af254-BP |
| WL30 | 228 | 238 | 246 | 252 | 252-BP af255 | 229 | 239 | 247 | 253 | 253-BP af252-BP |
| WL29 | 220 | 230 | 240 | 248 | 248-BP af253 | 221 | 231 | 241 | 249 | 247-BP af246-BP |
| WL28 | 212 | 222 | 232 | 242 | 242-BP af249 | 211 | 223 | 233 | 243 | 243-BP af242-BP |
| WL8 | 52 | 62 | 72 | 82 | 82-BP af91 | 53 | 63 | 73 | 83 | 83-BP af82-BP |
| WL7 | 44 | 54 | 64 | 74 | 74-BP af91 | 45 | 55 | 65 | 75 | 75-BP af74-BP |
| WL6 | 36 | 46 | 56 | 66 | 66-BP af75 | 37 | 47 | 57 | 67 | 67-BP af66-BP |
| WL5 | 28 | 38 | 48 | 58 | 58-BP af67 | 29 | 39 | 49 | 59 | 59-BP af58-BP |
| WL4 | 20 | 30 | 40 | 50 | 50-BP af59 | 21 | 31 | 41 | 51 | 51-BP af50-BP |
| WL3 | 12 | 22 | 32 | 42 | 42-BP af51 | 13 | 23 | 33 | 43 | 43-BP af42-BP |
| WL2 | 6 | 14 | 24 | 34 | 34-BP af43 | 7 | 15 | 25 | 35 | 35-BP af34-BP |
| WL1 | 2 | 8 | 16 | 26 | 26-BP af35 | 3 | 9 | 17 | 27 | 27-BP af26-BP |
| WL0 | 0 | 4 | 10 | 18 | 18-BP af27 | 1 | 5 | 11 | 19 | 19-BP af18-BP |

PAGE 18 BACK PROGRAM AFTER PAGE 27

|  | EVEN | | | | | ODD | | | | |
| --- | --- | --- | --- | --- | --- | --- | --- | --- | --- | --- |
|  | LP-1 | LP-2 | LP-3 | UP | BP | LP-1 | LP-2 | LP-3 | UP | BP |
| WL31 | 236 | 244 | 250 | 254 | 254-BP at253-BP | 237 | 245 | 251 | 255 | 255-BP at254-BP |
| WL30 | 228 | 238 | 246 | 252 | 252-BP at255 | 229 | 239 | 247 | 253 | 253-BP at252-BP |
| WL29 | 220 | 230 | 240 | 248 | 248-BP at253 | 221 | 231 | 241 | 249 | 247-BP at246-BP |
| WL28 | 212 | 222 | 232 | 242 | 242-BP at249 | 211 | 223 | 233 | 243 | 243-BP at242-BP |
|  |  |  |  |  |  |  |  |  |  |  |
| WL8 | 52 | 62 | 72 | 82 | 82-BP at91 | 53 | 63 | 73 | 83 | 83-BP at82-BP |
| WL7 | 44 | 54 | 64 | 74 | 74-BP at91 | 45 | 55 | 65 | 75 | 75-BP at74-BP |
| WL6 | 36 | 46 | 56 | 66 | 66-BP at75 | 37 | 47 | 57 | 67 | 67-BP at66-BP |
| WL5 | 28 | 38 | 48 | 58 | 58-BP at67 | 29 | 39 | 49 | 59 | 59-BP at58-BP |
| WL4 | 20 | 30 | 40 | 50 | 50-BP at59 | 21 | 31 | 41 | 51 | 51-BP at50-BP |
| WL3 | 12 | 22 | 32 | 42 | 42-BP at51 | 13 | 23 | 33 | 43 | 43-BP at42-BP |
| WL2 | 6 | 14 | 24 | 34 | 34-BP at43 | 7 | 15 | 25 | 35 | 35-BP at34-BP |
| WL1 | 2 | 8 | 16 | 26 | 26-BP at35 | 3 | 9 | 17 | 27 | 27-BP at26-BP |
| WL0 | 0 | 4 | 10 | 18 | (18-BP at27) | 1 | 5 | 11 | 19 | 19-BP at18-BP |

PAGE 18 BACK PROGRAM AFTER PAGE 27

Fig. 2A

| REPROGRAM (WL0) | 1110 REPROGRAM | 0110 REPROGRAM | 0010 REPROGRAM | ... | 0111 REPROGRAM |
|---|---|---|---|---|---|
| BL | 0V | 0.3V | 0.6V | ... | 4.2V |
| SGD | 5V | 5V | 5V | ... | 5V |
| WL31 | Vpass | Vpass | Vpass | ... | Vpass |
| WL30 | Vpass | Vpass | Vpass | ... | Vpass |
| • | • | • | • | ... | • |
| • | • | • | • | ... | • |
| • | • | • | • | ... | • |
| WL3 | Vpass | Vpass | Vpass | ... | Vpass |
| WL2 | Vpass | Vpass | Vpass | ... | Vpass |
| WL1 | Vpass | Vpass | Vpass | ... | Vpass |
| WL0 | Vpgm | Vpgm | Vpgm | ... | Vpgm |
| SGS | 0V | 0V | 0V | ... | 0V |
| SRC | 1.5V | 1.5V | 1.5V | ... | 1.5V |
| a-tub | 0V | 0V | 0V | ... | 0V |

*FIG. 6A*

| | REPROGRAM (WL0) | | | | ... | |
|---|---|---|---|---|---|---|
| | WL0 REPROGRAM | 0111 REPROGRAM Verify | 0011 REPROGRAM Verify | 1110 REPROGRAM Verify | ... | |
| BL | 0V | 1V | 1V | | ... | 1V |
| SGD | 3.5V | 3.5V | 3.5V | | ... | 3.5V |
| WL31 | Vpass | Vread | Vread | | ... | Vread |
| WL30 | Vpass | Vread | Vread | | ... | Vread |
| • | • | • | • | | ... | • |
| • | • | • | • | | ... | • |
| • | • | • | • | | ... | • |
| WL3 | Vpass | Vread | Vread | | ... | Vread |
| WL2 | Vpass | Vread | Vread | | ... | Vread |
| WL1 | Vpass | Vread | Vread | | ... | Vread |
| WL0 | Vpgm | $V_{RP0111}$ | $V_{RP0011}$ | | ... | $V_{RP1110}$ |
| SGS | 0V | 3.5V | 3.5V | | ... | 3.5V |
| SRC | 1.5V | 0V | 0V | | ... | 0V |
| a-tub | 0V | 0V | 0V | | ... | 0V |

*FIG. 6B* a # NON-VOLATILE MULTILEVEL MEMORY CELL PROGRAMMING

This application is a Continuation of U.S. application Ser. No. 11/646,658, filed Dec. 28, 2006, the specifications of which are incorporated herein by reference.

TECHNICAL FIELD

The present disclosure relates generally to semiconductor devices and, more particularly, to memory devices having non-volatile memory cells.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory, among others.

Flash memory devices are utilized as non-volatile memory for a wide range of electronic applications. Flash memory devices typically use a one-transistor memory cell that allows for high memory densities, high reliability, and low power consumption.

Uses for flash memory include memory for personal computers, personal digital assistants (PDAs), digital cameras, and cellular telephones. Program code and system data, such as a basic input/output system (BIOS), are typically stored in flash memory devices. This information can be used in personal computer systems, among others.

Two common types of flash memory array architectures are the "NAND" and "NOR" architectures, so called for the logical form in which the basic memory cell configuration of each is arranged A NAND array architecture arranges its array of floating gate memory cells in a matrix such that the gates of each floating gate memory cell of the array are coupled by rows to word select lines. However each memory cell is not directly coupled to a column bit line by its drain. Instead, the memory cells of the array are coupled together in series, source to drain, between a source line and a column bit line.

Memory cells in a NAND array architecture can be configured, e.g., programmed, to a desired state. That is, electric charge can be placed on or removed from the floating gate of a memory cell to put the cell into a number of stored states. For example, a single level cell (SLC) can represent two binary states, e.g., 1 or 0. Flash memory cells can also store more than two binary states, e.g., 1111, 0111, 0011, 1011, 1001, 0001, 0101, 1101, 1100, 0100, 0000, 1000, 1010, 0010, 0110, and 1110. Such cells may be referred to as multi state memory cells, multibit cells, or multilevel cells (MLCs). MLCs can allow the manufacture of higher density memories without increasing the number of memory cells since each cell can represent more than one bit. MLCs can have more than one programmed state, e.g., a cell capable of representing four bits can have fifteen programmed states and an erased state.

As NAND flash memory is scaled, parasitic capacitance coupling between adjacent memory cell floating gates becomes a problem. Floating gate-to-floating gate interference can cause a wider Vt distribution when the distribution should be tighter. The wider distributions can result in a degraded programming performance as well as other problems.

These problems for single level cell (SLC) NAND arrays are even greater in a multiple level cell (MLC) NAND array. MLC memory stores multiple bits on each cell by using different threshold levels for each state that is stored. The difference between adjacent threshold voltage distributions may be very small as compared to an SLC memory device. Therefore, the effects of floating gate-to-floating gate coupling in an MLC device are greatly increased.

BRIEF DESCRIPTION OF THE DRAWINGS

FIG. 2A illustrates one embodiment of a table for the programming sequence of a four bit NAND non-volatile memory array according to the present disclosure.

FIG. 6A illustrates a table showing operation voltages applied to a NAND string of non-volatile memory cells during a reprogramming operation according to a programming embodiment of the present disclosure.

FIG. 6B illustrates a table showing operation voltages applied to a NAND string of non-volatile memory cells during a reprogramming operation according to a programming embodiment of the present disclosure.

DETAILED DESCRIPTION

Embodiments of the present disclosure provide methods, devices, and systems for programming non-volatile multilevel memory cells. In one embodiment the method includes programming an array of non-volatile multilevel memory cells, each cell having a number of lower pages and an upper page. The method includes programming a first lower page, programming a second lower page, programming a third lower page, programming an upper page, and reprogramming the upper page of a cell.

In various embodiments, the method includes programming the first, the second, and the third lower pages and the upper page in association with an even bit line and an odd bit line. The method includes alternating between programming the first, the second, and the third lower pages and the upper page associated with the even and the odd bit lines between a number world lines.

In the following detailed description of the present disclosure, reference is made to the accompanying drawings that form a part hereof, and in which is shown by way of illustration how various embodiments of the disclosure may be practiced. These embodiments are described in sufficient detail to enable those of ordinary skill in the art to practice the embodiments of this disclosure, and it is to be understood that other embodiments may be utilized and that process, electrical, or mechanical changes may be made without departing from the scope of the present disclosure.

Figure 1:
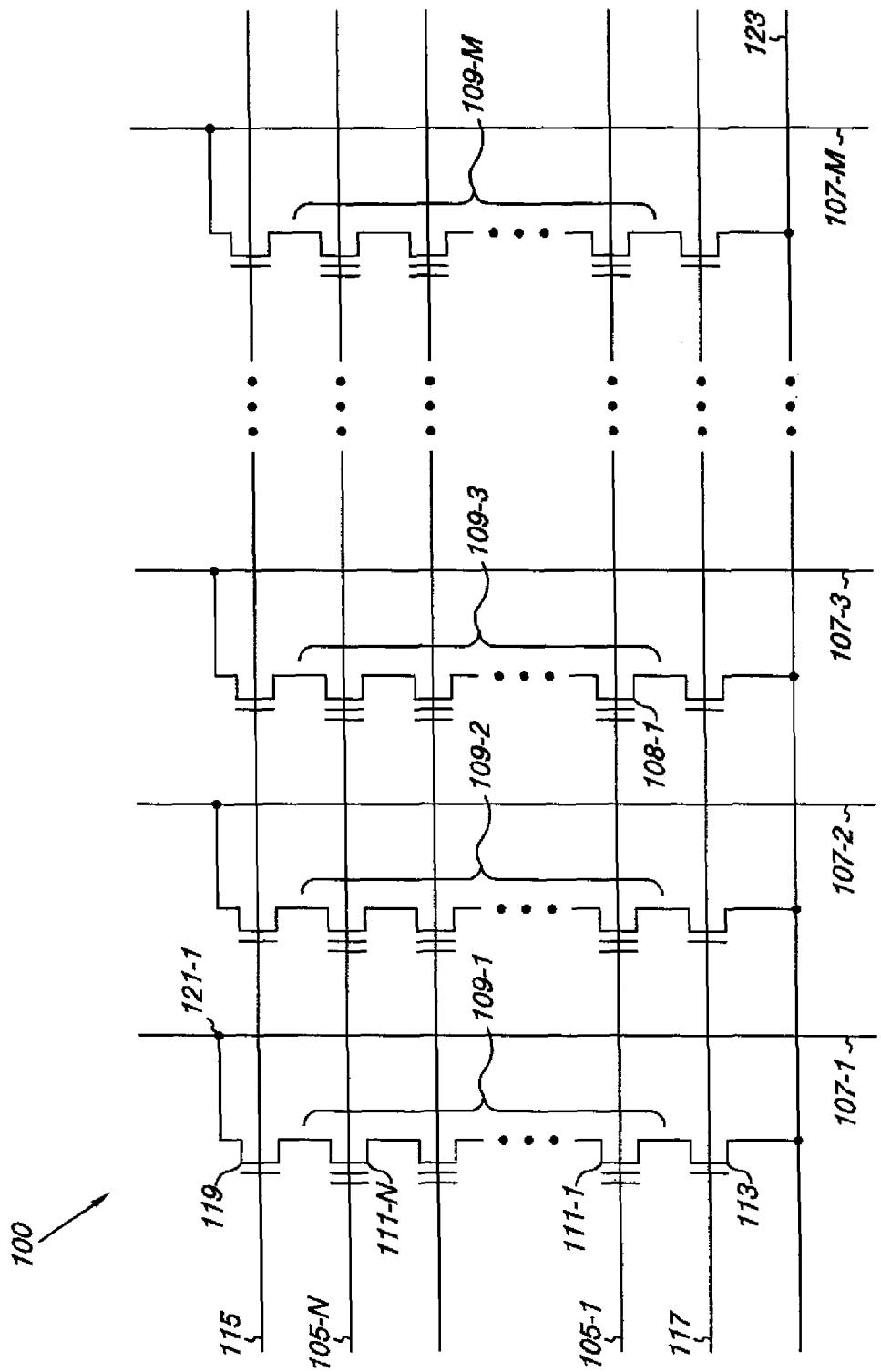
FIG. 1 is a schematic of a portion of a non-volatile memory array that can be used with embodiments of the present disclosure.

FIG. 1 is a schematic of a portion of a non-volatile memory array 100 that can be used with embodiments of the present disclosure. The embodiment of FIG. 1 illustrates a NAND architecture non-volatile memory. However, embodiments described herein are not limited to this example. As shown in FIG. 1, the memory array 100 includes word lines 105-1, ..., 105-N and intersecting bit lines 107-1, ..., 107-M. For ease of addressing in the digital environment, the number of word lines 105-1, ..., 105-N and the number of bit lines 107-1, ..., 107-M are each some power of two, e.g., 256 word lines by 4,096 bit lines.

Memory array 100 includes NAND strings 109-1, ..., 109-M. Each NAND string includes non-volatile memory cells 111-1, ..., 111-N, each located at an intersection of a word line 105-1, ..., 105-N and a local bit line 107-1, ..., 107-M. The non-volatile memory cells 111-1, ..., 111-N of each NAND string 109-1, ..., 109-M are connected in series source to drain between a source select gate (SGS), e.g., a field-effect transistor (FET) 113, and a drain select gate (SGD), e.g., FET 119. Source select gate 113 is located at the intersection of a local bit line 107-1 and a source select line 117 while drain select gate 119 is located at the intersection of a local bit line 107-1 and a drain select line 115.

As shown in the embodiment illustrated in FIG. 1, a source of source select gate 113 is connected to a common source line 123. The drain of source select gate 113 is connected to the source of the memory cell 111-1 of the corresponding NAND string 109-1. The drain of drain select gate 119 is connected to the local bit line 107-1 for the corresponding NAND string 109-1 at drain contact 121-1. The source of drain select gate 119 is connected to the drain of the last memory cell 111-N, e.g., floating-gate transistor, of the corresponding NAND string 109-1.

In various embodiments, construction of non-volatile memory cells, 111-1, ..., 111-N, includes a source, a drain, a floating gate or charge storage layer, and a control gate. Non-volatile memory cells, 111-1, ..., 111-N, have their control gates coupled to a word line, 105-1, ..., 105-N respectively. A column of the non-volatile memory cells, 111-1, ..., 111-N, make up the NAND strings, e.g., 109-1, ..., 109-M, coupled to a given local bit line, e.g., 107-1, ..., 107-M respectively. A row of the non-volatile memory cells are commonly coupled to a given word line, e.g., 105-1, ..., 105-N. An AND array architecture would be similarly laid out except that the string of memory cells would be coupled in parallel between the select gates.

FIG. 2A illustrates one embodiment of a table for the programming sequence of a four bit NAND non-volatile memory array according to the present disclosure. As shown in FIG. 2A the array illustrated may be a portion of a memory block that includes an even and an odd bit line.

As shown in the embodiment of FIG. 2A, a number of word lines, e.g., WL-0 through WL-31 are associated with even and odd bit lines. In one embodiment, programming is started from the bottom of the array with a word line that is adjacent to the source line of a particular block on non-volatile memory cells. In the illustrated embodiment, the adjacent word line is WL-0. In the embodiment, programming proceeds upward from WL-0 to WL-1, WL-2, ... WL-31, etc. The memory cells of the embodiment of FIG. 2A are multi-level cells (MLC) that each store four data bits. The table embodiment of FIG. 2A illustrates a programming order of each data bit. In this embodiment, the programming order is the same as the order of the logical page number. For example, the embodiment illustrates, sequentially programming a first lower page (e.g., LP-1), programming a second lower page (e.g., LP-2), programming a third lower page (e.g., LP-3), programming an upper page (e.g., UP), and reprogramming the upper page (e.g., BP) of cells. In various embodiments, and as described in detail below, the data programmed into the upper page of a cell is reprogrammed into the cell via a reprogramming operation. In various embodiments, the reprogramming of the upper page data of a cell occurs only after the upper page programming (e.g., UP) of each adjacent cell has been finished. Reprogramming the upper page data of cells after the upper page programming of all adjacent cells can tighten the Vt distributions of cells and can improve floating gate-to-floating gate interference.

As shown in the programming table embodiment of FIG. 2A, the method includes programming the first, the second, and the third lower pages (e.g., LP-1, LP-2, LP-3) and the upper page (e.g., UP) in association with an even bit line (EVEN) and an odd bit line (ODD). The method further includes alternating between programming the first, the second, and the third lower pages (e.g., LP-1, LP-2, LP-3) and the upper page (e.g., UP) associated with the even (EVEN) and the odd (ODD) bit lines between a number word lines (e.g., WL-0, WL-1, ..., WL-31).

As shown in FIG. 2A, beginning with a first word line WL-0, e.g., adjacent to a source line of a NAND array (e.g., source line 123 in FIG. 1), programming is alternated between programming the first, the second, and the third lower page (e.g., LP-1, LP-2, LP-3) and the upper page (e.g., UP) for cells associated with the even and the odd bit line between a number of next adjacent word lines (e.g., WL-1, WL-2, ..., WL-31). In various embodiments, the upper pages of cells are reprogrammed (e.g., an additional program/verify operation is performed) with the upper page data associated with the cells only after the upper page programming (e.g., UP) of each adjacent cell has been performed. As such, in various embodiments, reprogramming of the upper pages (e.g., BP) of cells of the even and the odd bit lines occurs after the upper page (e.g., UP) of the even and the odd bit line associated with a next adjacent word line from the source line (e.g., a second word line such as WL-1 in this example) has been programmed.

For instance, in the sequence embodiment illustrated in FIG. 2A, the reprogramming of the cells on WL-0 (e.g., the "18-BPaf27" programming operation for cells associated with even bit lines and "19-BPaf18-BP" programming operation for cells associated with odd bit lines as shown) occurs after the upper page programming (UP) of cells on WL-1. That is, the UP programming operations "26" and "27" for cells on WL-1 are finished prior to the performing of BP programming operations (e.g., upper page reprogramming) "18-BPaf27" and "19-BPaf18-BP" for cells on WL-0. In the table of FIG. 2A, the programming operation "18-BPaf27" intends that the data programmed into the upper pages of cells during programming operation "18" is reprogrammed into the upper page of those cells after programming operation "27" is performed (e.g., after the upper pages of odd bit line cells on WL-1 have been programmed). Similarly, the programming operation "19-BPaf18-BP" intends that the data programmed into the upper pages of odd bit line cells during programming operation "19" is reprogrammed into the upper page of those cells after programming operation "18-BPaf27" is performed (e.g., after the upper pages of even bit line cells on WL-0 have been reprogrammed).

In various embodiments, reprogramming the upper pages (e.g., BP) of cells of the even and the odd bit lines occurs after the upper page (e.g., UP) of the even and the odd bit line associated with a second word line (WL-1) from the source line has been programmed. For instance, in the sequence embodiment illustrated in FIG. 2A, the reprogramming of the cells on WL-0 (e.g., the "18-BPaf27" programming operation for cells associated with even bit lines and "19-BPaf18-BP" programming operation for cells associated with odd bit lines as shown) occurs after the upper page programming (UP) of cells on the next adjacent word line WL-1. That is, the UP programming operations "26" and "27" for cells on WL-1 are finished prior to the performing of BP programming operations (e.g., upper page reprogramming) "18-BPaf27" and "19-BPaf18-BP" for cells on WL-0. That is, the upper pages of cells on WL-0 are not reprogrammed until the upper page programming of adjacent cells (e.g., cells on next adjacent word line Wl-1) has finished.

As shown in the table embodiment of FIG. 2A, the programming sequence begins with a first word line, e.g., WL-0, adjacent to a source line of the NAND array, and is alternated between programming a first, a second, and a third lower page, e.g., LP-1, LP-2, LP-3, and an upper page, e.g., UP, for cells associated with an even (EVEN) and an odd (ODD) bit line between a number of next adjacent word lines. Hence, in one embodiment the method includes programming first lower pages, e.g., page 0 and page 1 (LP-1), of the even and the odd bit lines associated with a first word line, WL-0, and next programming first lower pages, e.g., page 2 and page 3 (LP-1) of the even and the odd bit lines associated with a second word line, WL-1. Next, the method includes programming second lower pages, e.g., page 4 and page 5 (LP-2), of the even and the odd bit lines associated with the first word line, WL-0. Next the method includes programming first lower pages, e.g., page 6 and page 7 (LP-1), of the even and the odd bit lines associated with a third word line, WL-2. The method then includes programming second lower pages, e.g., page 8 and page 9 (LP-2), of the even and the odd bit lines associated with the second word line, WL-1. The method then continues with programming third lower pages, e.g., page 10 and page 11 (LP-3), of the even and the odd bit lines associated with the first word line, WL-0.

According to the embodiment reflected in the table of FIG. 2A, the method includes programming first lower pages, e.g., page 12 and page 13 (LP-1), of the even and the odd bit lines associated a fourth word line, WL-3. The method then includes programming second lower pages, e.g., page 14 and page 15 (LP-2), of the even and the odd bit lines associated with the third word line, WL-2. Then, programming third lower pages, e.g., page 16 and page 17 (LP-3), of the even and the odd bit lines associated with the second word line, WL-1, occurs. Thereafter, upper pages, e.g., page 18 and page 19 (UP), of the even and the odd bit lines associated with the first word line, WL-0, are programmed. Next, the first lower pages, e.g., page 20 and page 21 (LP-1), of the even and the odd bit lines associated with the fifth word line, WL-4, are programmed. The method then includes programming second lower pages, e.g., page 22 and page 23 (LP-2), of the even and the odd bit lines associated with the fourth word line, WL-3. Next, programming the third lower pages, e.g., page 24 and page 25 (LP-3), of the even and the odd bit lines associated with the third word line, WL-2, occurs. Then upper pages, e.g., page 26 and page 27 (UP), of the even and the odd bit lines associated with the second word line, WL-1, occurs. According to the embodiment of the table shown in FIG. 2A, the method then includes reprogramming (BP) upper pages, e.g., page 18 and page 19 (18-BP after 27/19-BP after 18-BP), of the even and the odd bit lines associated with the first word line, WL-0.

The embodiment programming sequence illustrated by the table embodiment of FIG. 2A is continued through subsequent word lines, e.g. WL-5 through WL-N. In some embodiments the NAND array include 32 word lines in a block, e.g., WL-0 through WL-31. As such, the programming sequence described above for word lines WL-0 through WL-4 is continued through WL-31. Hence, the programming sequence for the embodiment of FIG. 2A is: program page 0, page 1, page 2, page 3, page 4, page 5, page 6, page 7, page 8, page 9, page 10, page 11, page 12, page 13, page 14, page 15, page 16, page 17, page 18 page 19, page 20, page 21, page 22, page 23, page 24, page 25, page 26, page 27; reprogram page 18, reprogram page 19; program page 28, page 29, page 30, page 31, page 32, page 33, page 34, page 35; reprogram 26, reprogram 27; etc. This sequence repeats for the entire memory block being programmed. As such, the upper pages, e.g., page 254 and page 255 (UP), of the even and the odd bit lines associated with the thirty-second word line (WL-31) are reprogrammed (254-BP after 253-UP/255-BP after 254-BP) last in this sequence.

Figure 2B:
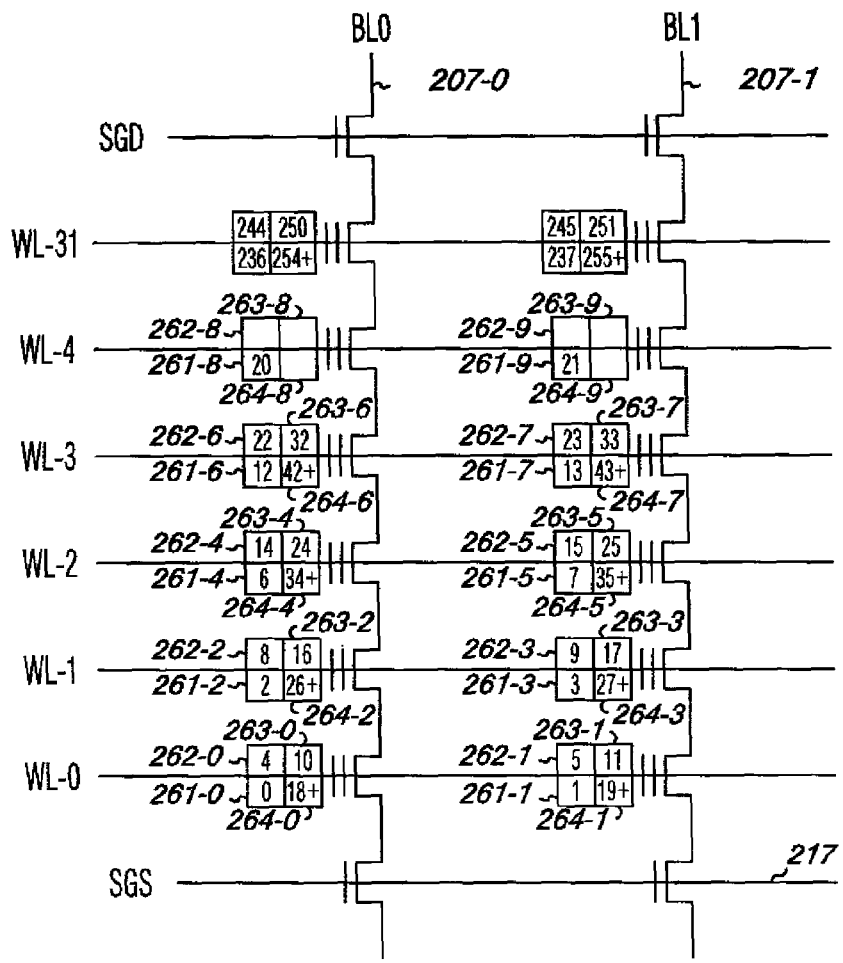
FIG. 2B illustrates an embodiment for programming a NAND array of four bit non-volatile memory cells on even and odd bit lines according to the present disclosure.
Figure 2C:
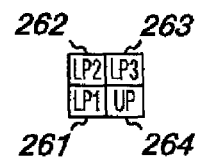
FIG. 2C illustrates a graphic to denote the various lower pages and the upper page as associated with each cell in the embodiment of FIG. 2B.

FIG. 2B illustrates an embodiment of a portion of a NAND array of four bit non-volatile memory cells on even and odd bit lines, e.g., BL0 AND BL1. For each cell in the embodiment of FIG. 2B, the lower left number 261 is the first lower page of programmed data, the upper left number 262 is the second lower page of programmed data, the upper right page 263 is the third lower page of programmed data, and the lower right page 265 is the upper page of programmed data. FIG. 2C illustrates a graphic to denote the various lower pages, e.g., 261, 262, 263, and the upper page, e.g., 264, as associated with each cell in the embodiment of FIG. 2B.

The embodiment of FIG. 2B illustrates beginning with a first word line, e.g., WL-0, adjacent to a select gate-source (SGS) line 217 of a NAND array and alternating between programming a first, e.g., 261, a second, e.g., 262, and a third lower page, e.g., 263, and an upper page, e.g., 264, for cells associated with even, e.g., BL0, and odd, e.g., BL1, bit lines between a number of next adjacent word lines, e.g., WL0-WL31, as well as reprogramming the upper pages of cells, e.g., reflected by "+" in upper page 264-0, of the even, BL0, and the odd, BL1, bit lines after a number of lower pages, e.g., 261, 262, 263, on different word lines, WL0-WL31, have been programmed.

As illustrated in the embodiment of FIG. 2B, one method includes programming a first lower page (page 0), 261-0, of the even bit line, BL0, and a first lower page (page 1), e.g., 261-1, of the odd bit line, BL1, associated with a first word line, e.g., WL-0. As shown in FIG. 2B, the embodiment includes next programming a first lower page (page 2), e.g., 261-2, of the even bit line, BL0, and a first lower page (page 3), e.g., 261-3 of the odd bit line, BL1, associated with a second word line, e.g., WL-1. As shown in the embodiment of FIG. 2B, the method includes next programming a second upper page (page 4), e.g., 262-0, of the even bit line, BL0 and a second lower page (page 5), e.g., 262-1, of the odd bit line, BL1, associated with the first word line, e.g., WL-0. As represented in the embodiment of FIG. 2B, the embodiment includes next programming a first lower page (page 6), e.g., 261-4, of even bit line, BL0, and first lower page (page 7), e.g., 261-5, of the odd bit line, BL1, associated with a third word line, e.g., WL-2. The embodiment next includes programming a second lower page (page 8), e.g., 262-2, of the even bit line, BL0, and a second lower page (page 9), e.g., 262-3, of the odd bit line, BL1, associated with the second word line, e.g., WL-1. The method next includes programming a third lower page (page 10), e.g., 263-0, of the even bit line, e.g., BL0, and a third lower page (page 11), e.g., 263-1 of the odd bit line, e.g., BL1, associated with the first word line, e.g., WL-0.

As shown in the embodiment of FIG. 2B, the method next includes programming a first lower page (page 12), e.g., 261-6, of the even bit line, e.g., BL0, and a first lower page (page 13), e.g., 261-7, of the odd bit line, e.g., BL1, associated with a fourth word line, e.g., WL-3. The method continues with programming a second lower page (page 14), e.g., 262-4, of the even bit line, BL0, and a second lower page (page 15), e.g., 262-5, of the odd bit line, e.g., BL1, associated with the third word line, e.g., WL-2. Next, the method includes programming a third lower page (page 16), e.g., 263-2, of the even bit line, e.g., BL0, and a third lower page (page 17), e.g., 263-3, of the odd bit line, e.g., BL1, associated with the second word line, e.g., WL-1. The method continues with programming an upper page (page 18), e.g., 264-0 of the even bit line, e.g., BL0, and an upper page (page 19), e.g., 264-1, of the odd bit line, e.g., BL1, associated with the first word line, e.g., WL-0. Next, in the embodiment of FIG. 2B, programming a first lower page (page 20), e.g., 261-8, of the even bit line, e.g., BL0, and a first lower page (page 21).e.g., 261-9, of the odd bit line, e.g., BL1, associated with the fifth word line, e.g., WL-4, occurs.

This is followed by programming a second lower page (page 22), e.g., 262-6, of the even bit line, e.g., BL0, and a second lower page (page 23), e.g., 262-7, of the odd bit line, e.g., BL1, associated with the fourth word line, e.g., WL-3. Then a third lower page (page 24), e.g., 263-4, of the even bit line, e.g., BL0, and a third lower page (page 25), e.g., 263-5, of the odd bit line, e.g., BL1, associated with the third word line, e.g., WL-2, is programmed. This is followed by programming an upper page (page 26), e.g., 264-2, of the even bit line, e.g., BL0, and an upper page (page 27), e.g., 264-3, of the odd bit line, e.g., BL1, associated with the second word line, e.g., WL-1. Next, reprogramming the upper page (page 18), e.g., 264-0, of the even bit line, e.g., BL0, and the upper page (page 19), e.g., 264-1, of the odd bit line, e.g., BL1, associated with the first word line, e.g., WL-0, occurs. In the embodiment of FIG. 2B this is illustrated by the symbol "+", shown as 18+ and 19+.

As such, according to the embodiment shown in FIG. 2B, the first lower pages (pages 0 and 1) of WL-0 are programmed first. Next, the first lower pages (pages 2 and 3) of WL-1 are programmed. The second lower pages (pages 4 and 5) of WL-0 are programmed next. The first lower pages (pages 6 and 7) of WL-2 are programmed next. The second lower pages (page 8 and 9) of WL-1 is programmed next. The third lower pages (pages 10 and 11) of WL-0 are programmed next. The first lower pages (pages 12 and 13) of WL-3 are programmed next. The second lower pages (pages 14 and 15) of WL-2 are programmed next. The third lower pages (pages 16 and 17) of WL-1 are programmed next. The upper pages (pages 18 and 19) of WL-0 are programmed next. The first lower pages (pages 20 and 21) of WL-4 are programmed next. The second lower pages (pages 22 and 23) of WL-3 are programmed next. The third lower pages (pages 24 and 25) of WL-2 are programmed next. The upper pages (pages 26 and 27) of WL-1 are programmed next.

Next, programming returns to the upper pages of (pages 18 and 19) of WL-0. This step reprograms the same data into pages 18 and 19 in order to tighten the distributions of the states of their respective cells. The reprogramming of pages 18 and 19 is shown in FIG. 2B as page 18+ and page 19+. This nomenclature is used throughout FIG. 2B to show that the page is initially programmed (page 18 and page 19) and then "reprogrammed" with the same data (i.e., +) to tighten the threshold voltage (Vt) distribution.

In the embodiment illustrated in FIG. 2B, and described above, the programming sequence results in the reprogramming of upper pages of cells after the upper page programming of adjacent cells has finished. For instance, the even bit line cell of WL-0 (e.g., the cell having associated pages 261-0, 262-0, 263-0 and 264-0) does not undergo a reprogramming ("+") operation until the upper page programming of the adjacent cells has occurred. In this example, the cells adjacent cell the even bit line cell of WL-0 include the even and odd bit line cells of adjacent word line WL-1 (e.g., the cell having associated pages 261-2, 262-2, 263-2 and 264-2 and the cell having associated pages 261-3, 262-3, 263-3 and 264-3), as well as the adjacent odd bit line cell of WL-0 (e.g., the cell having associated pages 261-1, 262-1, 263-1 and 264-1).

The reprogramming of the upper pages of the memory cells is performed using a program/verify operation. As one of ordinary skill in the art will appreciate upon reading this disclosure, the selected word line is biased with a series of programming pulses with a verify operation between each pulse. During this reprogramming operation, the cell is verified to a slightly higher voltage than when it was initially programmed. In one embodiment, the new verify voltage is in a range of 100-200 mV greater than the original verification operation.

Reprogramming method embodiments and operations associated therewith are discussed in greater detail below in connection with FIGS. 4, 5, 6A, and 6B.

Figure 3A:
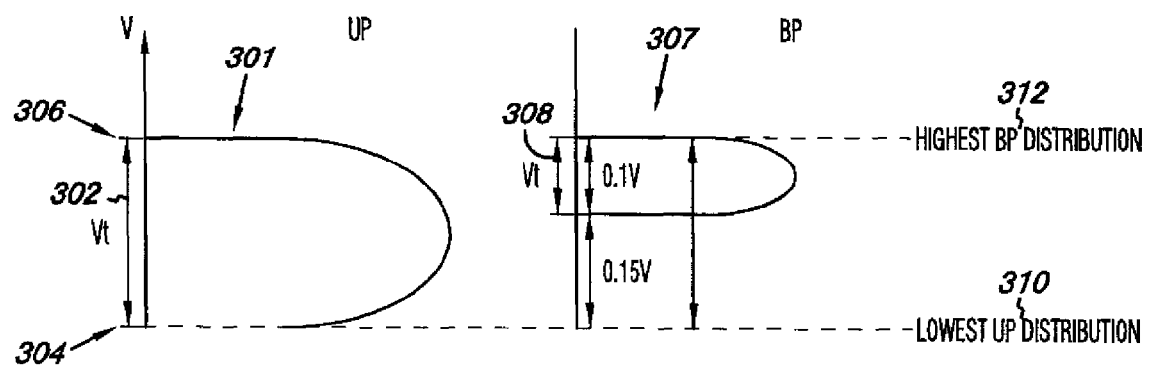
FIG. 3A illustrates a diagram of voltage a threshold Vt distribution for a particular cell state in accordance with embodiments of the present disclosure.

FIG. 3A illustrates a diagram of a voltage threshold Vt distribution for a particular cell state in accordance with embodiments of the present disclosure, e.g., of FIGS. 2A and 2B. Distribution 301 illustrates the threshold voltage Vt range 302 associated with distribution 301 after an upper page (UP) programming operation and prior to a reprogramming operation (BP) according to embodiments of the present disclosure. The Vt range 302 is defined by a lowest Vt level 304 and a highest Vt level 306. In some embodiments, this threshold voltage Vt distribution 301 may have a Vt level range 302 of 0.25 Volts, for example.

The Vt distribution 307 illustrates the threshold voltage Vt distribution 301 after the back page (BP) "reprogramming" operations according to embodiments of the present disclosure, e.g., after UP reprogramming as described in connection with FIGS. 2A and 2B. Distribution 307 illustrates the tightened Vt range 308 between the lowest UP threshold voltage level 310 and a highest BP threshold voltage level 312. As shown in the example embodiment of FIG. 3A, this tightened threshold voltage Vt distribution 307 may have a range 308 of 0.1 V, a clearly improved margin.

Figure 3B:
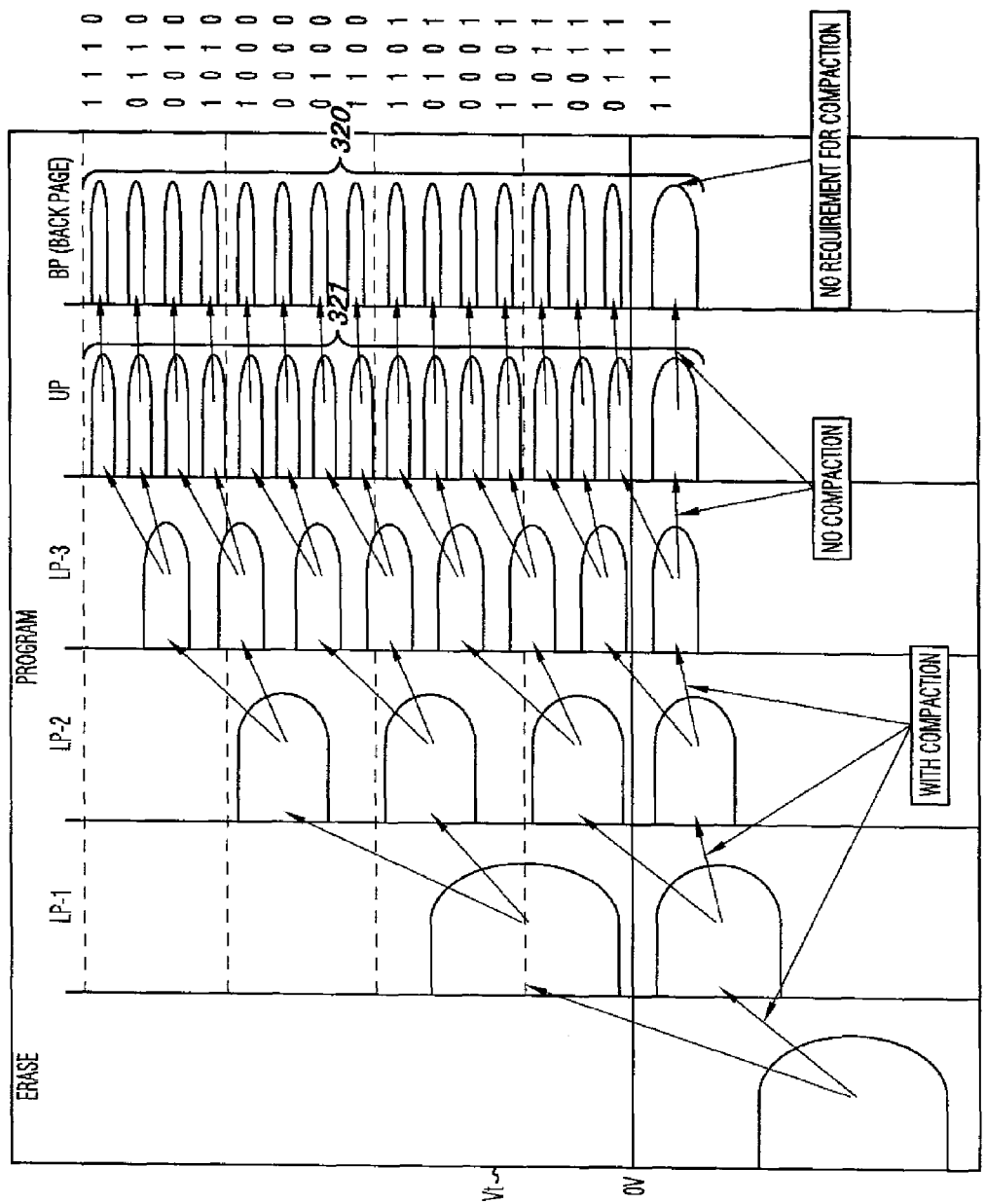
FIG. 3B illustrates a diagram of voltage threshold Vt distributions associated with an erase state and a number of programmed states in a four-bit non-volatile multilevel memory cell in accordance with embodiments of the present disclosure.

FIG. 3B illustrates a diagram of voltage threshold Vt distributions associated with an erase state (ERASE) and a number of programming operations (PROGRAM), e.g., LP-1, LP-2, LP-3, UP, and BP (BACK PAGE), in a four-bit (4-bit) non-volatile multilevel memory cell capable of storing sixteen (16) different states as can be used in a NAND array. In this embodiment, the states are a logical "1111", "0111", "0011", "1011", "1001", "0001", "0101", "1101", "1100", "0100", "0000", "1000", "1010", "0010", "0110", and "1110". The number of states shown in the embodiment of FIG. 3B can be programmed according to the embodiments described in connection FIGS. 2A and 2B above. Alternate embodiments can use a different order for the programmed states.

As shown by the arrows in FIG. 3B, programming from out of the erased state to a programmed state is done with a first lower page programming operation, e.g., LP-1, a second lower page programming operation, e.g., LP-2, a third lower page programming operation, e.g., LP-3, an upper page programming operation, e.g., UP, and a reprogramming operation, e.g., BP. After performing programming embodiments according to the present disclosure, the Vt level of cells being programmed are within one of the Vt distributions 320. In various embodiments, the upper pages of cells are reprogrammed (BP) after upper page programming UP such that the Vt distributions 321 corresponding to particular logical states, data, are tightened (e.g., as shown by the Vt distributions 320 being narrower than Vt distributions 321). Reprogramming (BP) operations and corresponding verify operations are described further in connection with FIGS. 4, 5, 6A, and 6B below.

Figure 4:
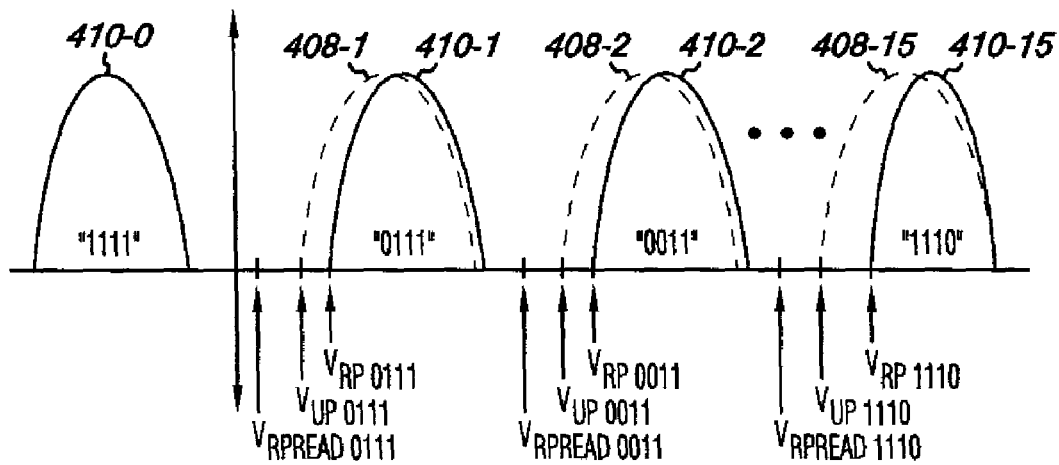
FIG. 4 illustrates a diagram of Vt distributions associated with an erase state and a number of programmed states in a four-bit non-volatile multilevel memory cell in accordance with embodiments of the present disclosure.

FIG. 4 illustrates a diagram of Vt distributions associated with an erase state and a number of programmed states in a four-bit non-volatile multilevel memory cell in accordance with embodiments of the present disclosure. That is, similar to the embodiment shown in FIG. 3B, the embodiment illustrated in FIG. 4 includes a number of Vt distributions after an upper page programming (UP) (e.g., distributions 321 in FIG. 3B) and after a reprogramming (BP) (e.g., distributions 320 in FIG. 3B). In FIG. 4, Vt distribution 410-0 corresponds to an erase state (e.g., logical "1111" in this example), Vt distributions 408-1, 408-2, . . . , 408-15 correspond to program states (e.g., logical "0111", "0011", . . . , "1110" in this example) after upper page programming, and Vt distributions 410-1, 410-2, . . . , 410-15 correspond to the program states (e.g., logical "0111", "0011", . . . , "1110") after the upper pages have been reprogrammed.

Figure 5:
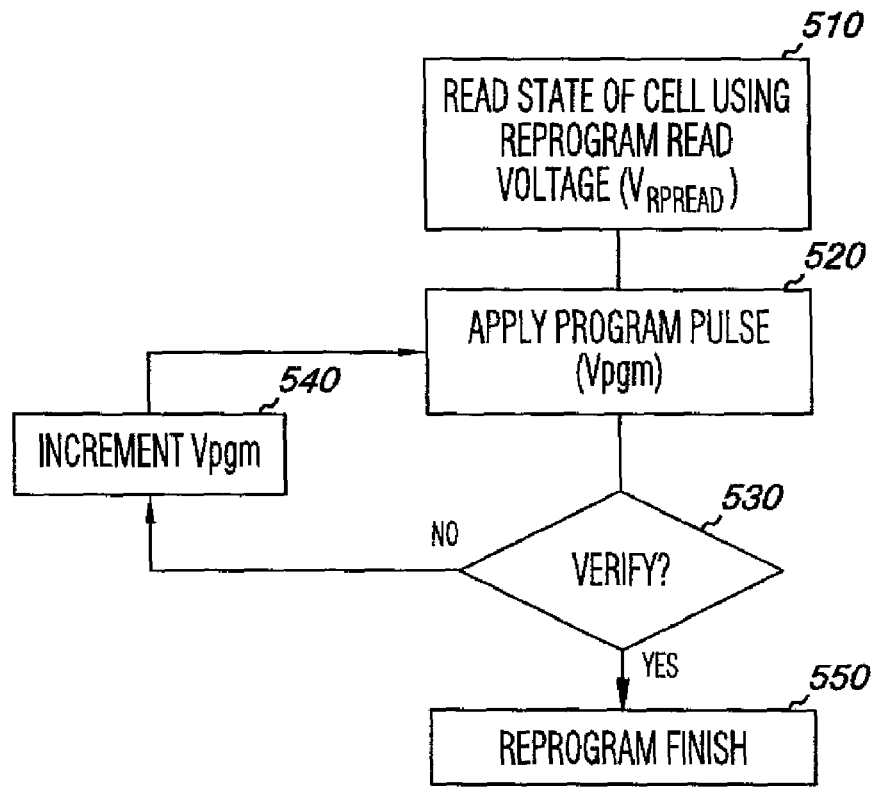
FIG. 5 illustrates a flow chart of a reprogramming method in accordance with embodiments of the present disclosure.

FIG. 5 illustrates a flow chart of a reprogramming method in accordance with embodiments of the present disclosure. The discussion of the method illustrated in FIG. 5 refers to voltages shown in FIGS. 4, 6A, and 6B (e.g., $V_{RPREAD0111}$, $V_{UP0111}$, $V_{RP0111}$, $V_{RPREAD0111}$, etc.). The method illustrated in FIG. 5 can be used with the various programming sequences discussed herein, such as programming sequences discussed in connection with FIGS. 2A, 2B, and 3B.

According to various embodiments a state of a cell is read to determine the cell state after upper page (UP) programming. At block 510 of the method illustrated in FIG. 5, the state of a cell is read using a reprogramming read voltage ($V_{RPREAD}$), e.g., $V_{RPREAD0111}$, $V_{RPREAD0011}$, . . . , $V_{RPREAD1110}$ as shown in FIG. 4. These reprogram read voltages are going to be less than their respective upper page program verify voltages ($V_{UP}$), e.g., $V_{UP0111}$ $V_{UP0011}$, . . . , $V_{UP1110}$ as shown in FIG. 4. Once stored data is known (e.g., the logical state of cell has been determined), the reprogramming method continues at block 520, with a programming pulse being applied to the control gate of the cell (e.g., Vpgm) as shown in FIGS. 6A and 6B.

At block 530 of the embodiment illustrated in FIG. 5, a program verify operation is performed after the programming pulse is applied to the cell. If the verify operation is unsuccessful (e.g., the Vt level of the cell is not verified to be within the Vt distribution corresponding to the proper logical state of the cell), then the programming pulse (Vpgm) is incremented at block 540. If the verify operation is successful (e.g., the Vt level of the cell is verified to be within the Vt distribution corresponding to the proper logical state of the cell), then the reprogramming operation is finished at block 550.

FIGS. 6A and 68 illustrate tables showing operation voltages applied to a NAND string of non-volatile memory cells during a reprogramming operation according to a programming embodiment of the present disclosure. The embodiments illustrated in FIGS. 6A and 6B show voltages applied during reprogramming of cells on a first word line adjacent to a source select gate (SGS), e.g., WL0 in this example.

In the embodiment illustrated in FIG. 6A, the logical state of the cell to be reprogrammed has been determined (e.g., block 510 of FIG. 5). In this embodiment, a bit line voltage (BL) that corresponds to the proper program state (e.g., 1110, 0110, 0010, . . . , 0111) is determined, and the determined bit line voltage is then used to reprogram the cell. A suitable bit line voltage can be determined in various ways. For example, in an embodiment, the bit line voltage can be determined by the difference between the minimum desired Vt level after reprogramming the upper page (reprogramming verify voltage $V_{RP}$), e.g., $V_{RP0111}$, $V_{RP0011}$, . . . , $V_{RP1110}$ as shown in FIG. 4, and the minimum desired Vt level after reprogramming associated with the highest program state, e.g., "1110" in this example. For instance, in the embodiment illustrated in FIG. 6A, the bit line voltage to be used during reprogramming cells corresponding to data "0010" (0010 REPROGRAM), can be determined by subtracting $V_{RP0111}$, $V_{RP0011}$, . . . , $V_{RP0111}$. It is noted that, the reprogramming verify voltages $V_{RP0111}$, $V_{RP0011}$, . . . , $V_{RP1110}$ are greater than the corresponding upper page program verify voltages $V_{UP0111}$, $V_{UP0011}$, . . . , $V_{UP1110}$, as shown in FIG. 4.

In the embodiment illustrated in FIG. 6A, the bit line voltage used to reprogram cells representing data "1110" is 0V, the bit line voltage used to reprogram cells representing data "0110" is 0.3V, the bit line voltage used to reprogram cells representing data "0010" is 0.6V, and the bit line voltage used to reprogram cells representing data "0111" is 4.2V. Embodiments are not limited to these example bit line voltages.

As discussed in connection with FIG. 5 above, if the verification operation (e.g., block 530) passes, the programming operation is successfully completed (e.g., block 550). If the verification determines that the upper page has not been successfully reprogrammed, the programming voltage (Vpgm) is incremented (e.g., block 540) to the next programming voltage and the program/verify operations are repeated. An example of the above described program/verify operations is provided in a commonly assigned, copending patent application by the same inventor as herein, application Ser. No. 11/448,063 entitled "Programming a Non-Volatile Memory Device", filed Jun. 6, 2006. The same is incorporated herein in full by reference.

In the embodiment illustrated in FIG. 6B, the logical state of the cell to be reprogrammed has been determined (e.g., block 510 of FIG. 5). In the embodiment of FIG. 6B, during reprogramming of the upper pages of cells on a word line (WL0 REPROGRAM), programming pulses (Vpgm) are applied to the cells until each cell is verified to have reached the proper Vt level. For instance, as shown in the table of FIG. 6B, cells being reprogrammed to the "0111" state receive Vpgm pulses until the Vt level of the cell is above the corresponding reprogramming verify voltage (e.g., $V_{RP0111}$). Cells being reprogrammed to the "0011" state receive Vpgm pulses until the Vt level of the cell is above the corresponding reprogramming verify voltage (e.g., $V_{RP0011}$). The programming voltage (Vpgm) continues to be incremented until program verify operations (0111 REPROGRAM, 0011 REPROGRAM, . . . , 1110 REPROGRAM) determine that each of the cells being reprogrammed has a Vt level above the proper reprogramming verify voltage ($V_{RP0111}$, $V_{RP0011}$, . . . , $V_{RP1110}$). In the embodiment illustrated in FIG. 6B, the bit line voltage (BL) is inhibited (e.g., increased to a Vcc voltage such as 1V as shown) when the Vt of the cell reaches the proper level.

As shown in the embodiment of FIG. 3B, programming the number of states may be performed with and without the use of compaction. For example, in various embodiments, only the logical states having the widest threshold voltage (Vt) distributions are reprogrammed. For example, in one embodiment, the widest state is the "1110" state that is nearest to the erased state "1111". Reprogramming only the upper page of the widest state provides faster programming speed and a tighter threshold voltage distribution. In various embodiments the programming states other than "1110" already have a tighter Vt distribution than the "1110" state. In such embodiments, if the state of a cell is determined to by anything other than the widest state, e.g., the state nearest the erase state, the upper page reprogramming is not performed. Embodiments are not limited to reprogramming the upper page.

Figure 7:
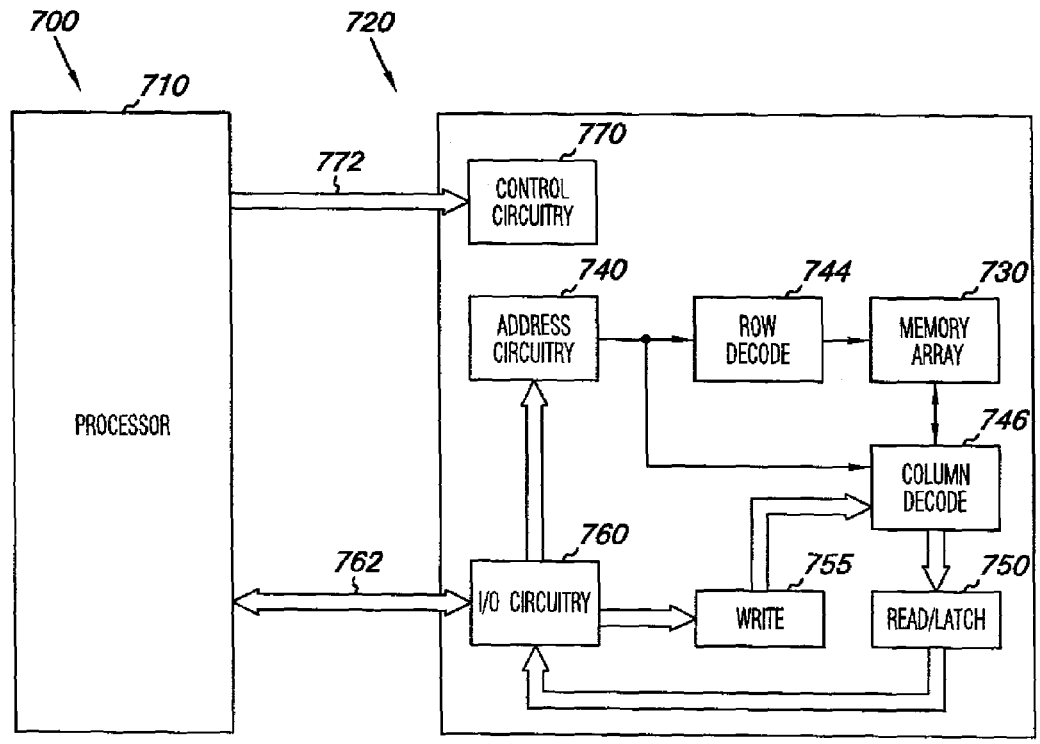
FIG. 7 is a functional block diagram of an electronic memory system having at least one memory device in accordance with an embodiment of the present disclosure.

FIG. 7 is a functional block diagram of an electronic memory system having at least one memory device in accordance with an embodiment of the present disclosure. Memory system 700 includes a processor 710 coupled to a non-volatile memory device 720 that includes a memory array 730 of non-volatile cells. The memory system 700 can include separate integrated circuits or both the processor 710 and the memory device 720 can be on the same integrated circuit. The processor 710 can be a microprocessor or some other type of controlling circuitry such as an application-specific integrated circuit (ASIC).

For clarity, the electronic memory system 700 has been simplified to focus on features with particular relevance to the present disclosure. The memory device 720 includes an array of non-volatile memory cells 730, which can be floating gate flash memory cells with a NAND architecture. The control gates of each row of memory cells are coupled with a word line, while the drain regions of the memory cells are coupled to bit lines. The source regions of the memory cells are coupled to source lines, as the same has been illustrated in FIG. 1. As will be appreciated by those of ordinary skill in the art, the manner of connection of the memory cells to the bit lines and source lines depends on whether the array is a NAND architecture, a NOR architecture, and AND architecture, or some other memory array architecture.

The embodiment of FIG. 7 includes address circuitry 740 to latch address signals provided over I/O connections 762 through I/O circuitry 760. Address signals are received and decoded by a row decoder 744 and a column decoder 746 to access the memory array 730. In light of the present disclosure, it will be appreciated by those skilled in the art that the number of address input connections depends on the density and architecture of the memory array 730 and that the number of addresses increases with both increased numbers of memory cells and increased numbers of memory blocks and arrays.

The memory array 730 of non-volatile cells can include non-volatile multilevel memory cells programmed according to embodiments described herein. The memory device 720 reads data in the memory array 730 by sensing voltage and/or current changes in the memory array columns using sense/buffer circuitry that in this embodiment can be read/latch circuitry 750. The read/latch circuitry 750 can be coupled to read and latch a row of data from the memory array 730. I/O circuitry 760 is included for bi-directional data communication over the I/O connections 762 with the processor 710. Write circuitry 755 is included to write data to the memory array 730.

Control circuitry 770 decodes signals provided by control connections 772 from the processor 710. These signals can include chip signals, write enable signals, and address latch signals that are used to control the operations on the memory array 730, including data read, data write, and data erase operations. In various embodiments, the control circuitry 770 is responsible for executing instructions from the processor 710 to perform the operating and programming embodiments of the present disclosure. The control circuitry 770 can be a state machine, a sequencer, or some other type of controller. It will be appreciated by those skilled in the art that additional circuitry and control signals can be provided, and that the memory device detail of FIG. 7 has been reduced to facilitate ease of illustration.

Figure 8:
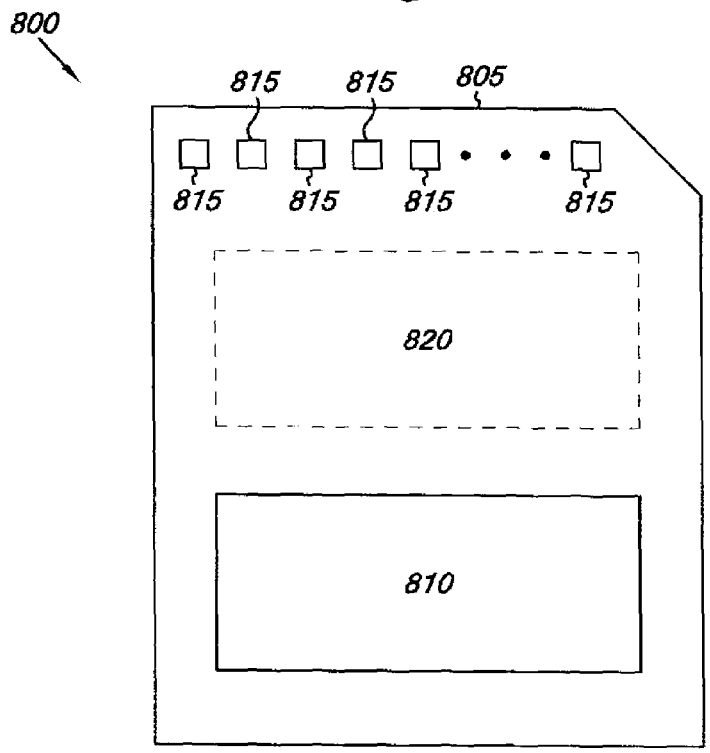
FIG. 8 is a functional block diagram of a memory module having at least one memory device in accordance with an embodiment of the present disclosure.

FIG. 8 is a functional block diagram of a memory module having at least one memory device in accordance with an embodiment of the present disclosure. Memory module 800 is illustrated as a memory card, although the concepts discussed with reference to memory module 800 are applicable to other types of removable or portable memory (e.g., USB flash drives) and are intended to be within the scope of "memory module" as used herein. In addition, although one example form factor is depicted in FIG. 8, these concepts are applicable to other form factors as well.

In some embodiments, memory module 800 will include a housing 805 (as depicted) to enclose one or more memory devices 810, though such a housing is not essential to all devices or device applications. At least one memory device 810 includes an array of non-volatile multilevel memory cells programmed according to embodiments described herein. Where present, the housing 805 includes one or more contacts 815 for communication with a host device. Examples of host devices include digital cameras, digital recording and playback devices, PDAs, personal computers, memory card readers, interface hubs and the like. For some embodiments, the contacts 815 are in the form of a standardized interface. For example, with a USB flash drive, the contacts 815 might be in the form of a USB Type-A male connector. For some embodiments, the contacts 815 are in the form of a semi-proprietary interface, such as might be found on CompactFlash™ memory cards licensed by SanDisk Corporation, Memory Stick™ memory cards licensed by Sony Corporation, SD Secure Digital™ memory cards licensed by Toshiba Corporation and the like. In general, however, contacts 815 provide an interface for passing control, address and/or data signals between the memory module 800 and a host having compatible receptors for the contacts 815.

The memory module 800 may optionally include additional circuitry 820, which may be one or more integrated circuits and/or discrete components. For some embodiments, the additional circuitry 820 may include a memory controller for controlling access across multiple memory devices 810 and/or for providing a translation layer between an external host and a memory device 810. For example, there may not be a one-to-one correspondence between the number of contacts 815 and a number of 810 connections to the one or more memory devices 810. Thus, a memory controller could selectively couple an I/O connection (not shown in FIG. 8) of a memory device 810 to receive the appropriate signal at the appropriate I/O connection at the appropriate time or to provide the appropriate signal at the appropriate contact 815 at the appropriate time. Similarly, the communication protocol between a host and the memory module 800 may be different than what is required for access of a memory device 810. A memory controller could then translate the command sequences received from a host into the appropriate command sequences to achieve the desired access to the memory device 810. Such translation may further include changes in signal voltage levels in addition to command sequences.

The additional circuitry 820 may further include functionality unrelated to control of a memory device 810 such as logic functions as might be performed by an ASIC. Also, the additional circuitry 820 may include circuitry to restrict read or write access to the memory module 800, such as password protection, biometrics or the like. The additional circuitry 820 may include circuitry to indicate a status of the memory module 800. For example, the additional circuitry 820 may include functionality to determine whether power is being supplied to the memory module 800 and whether the memory module 800 is currently being accessed, and to display an indication of its status, such as a solid light while powered and a flashing light while being accessed. The additional circuitry 820 may further include passive devices, such as decoupling capacitors to help regulate power requirements within the memory module 800.

CONCLUSION

Methods, devices, modules, and systems for programming multilevel non-volatile memory cells have been shown. Each cell includes a number of lower pages and an upper page. One method includes programming a first lower page, programming a second lower page, programming a third lower page, programming an upper page, and reprogramming the upper page of a cell.

In various embodiments, the method includes programming the first, the second, and the third lower pages and the upper page in association with an even bit line and an odd bit line. The method includes alternating between programming the first, the second, and the third lower pages and the upper page, and reprogramming the upper page (e.g., BP), associated with the even and the odd bit lines between a number world lines.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for programming an array of memory cells, the method comprising:
   programming a first lower page, a second lower page and a third lower page of selected cells of a first group of cells having commonly coupled control gates;
   programming an upper page of the selected cells of the first group; wherein performing the first, the second, and the third lower page programming and the upper page programming for the selected cells of the first group includes alternating between performing the first, the second, and the third lower page programming and the upper page programming for cells associated with a first subset and a second subset of bit lines;
   subsequently programming an upper page of selected cells of a second group of cells having commonly coupled control gates, the second group of cells adjacent the first group; and
   reprogramming the upper page of the selected cells of the first group after the upper page programming of the selected cells of the second group has finished;
   wherein the method includes reprogramming the upper page of cells associated with the first subset of bit lines after the upper page programming of cells associated with the second subset of bit lines has finished; and
   wherein the method includes reprogramming the upper page of the selected cells of the first group only when a target state of the selected cells of the first group is a state nearest to an erase state.

2. The method of claim 1, wherein reprogramming the upper page of the selected cells of the first group includes using a reprogramming verify voltage that is greater than a program verify voltage associated with programming the upper page of the selected cells of the first group.

3. The method of claim 1, wherein reprogramming the upper page of the selected cells of the first group includes performing an additional program/verify operation on the cells of the first group.

4. A method for programming an array of memory cells, the method comprising:
   beginning with a first row of cells of the array, alternating between programming a first, a second, and a third lower page and an upper page for cells associated with a first and a second subset of bit lines between a number of next adjacent rows of cells;
   programming a first lower page of the first subset of bit lines and a first lower page of the second subset of bit lines associated with the first row of cells;
   next, programming a first lower page of the first subset of bit lines and a first lower page of the second subset of bit lines associated with the second row of cells;
   next, programming a second lower page of the first subset of bit lines and a second lower page of the second subset of bit line associated with the first row;
   next, programming a first lower page of the first subset of bit lines and a first lower page of the second subset of bit lines associated with a third row of cells;
   next, programming a second lower page of the first subset of bit lines and a second lower page of the second subset of bit lines associated with the second row;
   next, programming a third lower page of the first subset of bit lines and a third lower page of the second subset of bit lines associated with the first row;
   reprogramming upper pages of cells of the first and the second subset of bit lines after a number of lower pages of cells in different rows have been programmed, including reprogramming upper pages of selected cells in the first row after programming of upper pages of selected cells in a second row of cells has finished; and
   wherein the method includes performing a reprogramming operation to reprogram upper pages of cells associated with the first subset of bit lines after the upper page programming operation to program upper pages of cells associated with the second subset of bit lines has finished.

5. The method of claim 4, wherein the method includes:
   programming a first lower page of the first subset of bit lines and a first lower page of the second subset of bit line associated a fourth row of cells;
   programming a second lower page of the first subset of bit lines and a second lower page of the second subset of bit lines associate with the third row;

programming a third lower page of the first subset of bit lines and a third lower page of the second subset of bit lines associated with the second row;

programming an upper page of the first subset of bit lines and an upper page of the second subset of bit lines associated with the first row; and programming a first lower page of the first subset of bit lines and a first lower page of the second subset of bit lines associated with a fifth row of cells.

6. The method of claim 5, wherein the method includes:

programming a second lower page of the first subset of bit lines and a second lower page of the second subset of bit lines associated with the fourth row;

programming a third lower page of the first subset of bit lines and a third lower page of the second subset of bit lines associated with the third row;

programming an upper page of the first subset of bit lines and an upper page of the second subset of bit lines associated with the second row; and reprogramming the upper page of the first subset of bit lines and the upper page of the second subset of bit lines associated with the first row.

7. The method of claim 4, wherein the first row of cells is adjacent to a source line of the array.

8. The method of claim 4, wherein the first subset of bit lines are even bit lines and second subset of bit lines are odd bit lines.

9. A memory device comprising:
an array of memory cells; and
control circuitry coupled to the array and configured to execute a method for programming data that includes:
  alternately programming a first lower page in association with a first bit line of a first subset of bit lines and a second bit line of a second subset of bit lines between a number of groups of cells having commonly coupled control gates;
  alternately programming a second lower page in association with the first and the second bit line between the number of groups of cells having commonly coupled control gates;
  alternately programming a third lower page in association with the first and the second bit line between the number of groups;
  alternately programming an upper page in association with the first and the second bit line between the number of groups;
  alternately reprogramming the upper page of a cell in association with the first and the second bit line between the number of groups; and
  wherein reprogramming the upper page of the cell in association with the first and the second bit line occurs after upper page programming of a cell in a next adjacent group has finished; and
  wherein the control circuitry is configured to determine a bit line voltage used to reprogram the cell based on a determined difference between a minimum desired threshold voltage level after the reprogramming operation and a minimum desired threshold voltage level after reprogramming associated with an uppermost program state.

10. The device of claim 9, wherein the method includes:
beginning with a first group of cells adjacent to a source line of the array, alternating between programming the first, the second, and the third lower page and the upper page for cells associated with the first and the second bit line between a number of next adjacent groups of cells;
reprogramming the upper pages of cells of the first and the second bit lines after the third lower page of the first and the second bit line associated with a third group of cells from the source line has been programmed.

11. The device of claim 9, wherein the array is a NAND array of multilevel memory cells.

12. The device of claim 9, wherein the control circuitry is configured to:
determine a logical state of the cell to be reprogrammed; and
determine a bit line voltage used to reprogram the cell in response to the determined logical state.

13. The device of claim 9, wherein reprogramming upper pages of the groups of cells of the first and second bit lines includes using a reprogramming verify voltage that is greater than a program verify voltage associated with programming the upper pages of the groups of cells.

14. The device of claim 9, wherein reprogramming upper pages of the groups of cells of the first and second bit lines includes performing an additional program operation and an additional verify operation on the groups of cells.

15. The device of claim 9, wherein the number of groups of cells having commonly coupled control gates correspond to respective word lines associated with the array.

16. The device of claim 9, wherein the control circuitry is configured to reprogram the upper page only when a target state of the cell is a program state nearest to an erase state.

17. A memory device comprising:
an array of memory cells; and
control circuitry coupled to the array and configured to execute a method for programming data that includes:
  alternately programming a first lower page in association with a first bit line of a first subset of bit lines and a second bit line of a second subset of bit lines between a number of groups of cells having commonly coupled control gates;
  alternately programming a second lower page in association with the first and the second bit line between the number of groups of cells having commonly coupled control gates;
  alternately programming a third lower page in association with the first and the second bit line between the number of groups;
  alternately programming an upper page in association with the first and the second bit line between the number of groups;
  alternately reprogramming the upper page of a cell in association with the first and the second bit line between the number of groups; and
  wherein reprogramming the upper page of the cell in association with the first and the second bit line occurs after upper page programming of a cell in a next adjacent group has finished
  wherein the control circuitry is configured to reprogram the upper page only when a target state of the cell is a program state nearest to an erase state.

* * * * *